(12) United States Patent
Kim et al.

(10) Patent No.: US 12,505,811 B2
(45) Date of Patent: Dec. 23, 2025

(54) DISPLAY PANEL AND DISPLAY APPARATUS

(71) Applicant: LG Display Co., Ltd., Seoul (KR)

(72) Inventors: KyungSu Kim, Paju-si (KR); Jangdae Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 390 days.

(21) Appl. No.: 18/452,264

(22) Filed: Aug. 18, 2023

(65) Prior Publication Data

US 2024/0071323 A1 Feb. 29, 2024

(30) Foreign Application Priority Data

Aug. 24, 2022 (KR) .................. 10-2022-0106100

(51) Int. Cl.
*G09G 3/3291* (2016.01)

(52) U.S. Cl.
CPC ... *G09G 3/3291* (2013.01); *G09G 2320/0214* (2013.01); *G09G 2320/0233* (2013.01); *G09G 2330/00* (2013.01)

(58) Field of Classification Search
CPC .... H10K 59/123; H10K 59/131; H10D 86/40; H10D 86/423; H10D 86/431; H10D 86/441; H10D 86/60; G09G 3/3233; G09G 3/3291; G09G 2300/0426; G09G 2300/0819; G09G 2300/0861; G09G 2310/0251; G09G 2310/0262; G09G 2320/0214; G09G 2320/043; G09G 2320/0233; G09G 2330/00
See application file for complete search history.

(56) References Cited

U.S. PATENT DOCUMENTS

| 11,501,711 | B2 | 11/2022 | Hwang et al. |
| 2015/0123084 | A1* | 5/2015 | Kim .................. H10D 86/60 257/43 |
| 2021/0090494 | A1 | 3/2021 | Hwang et al. |
| 2023/0061983 | A1* | 3/2023 | Jeong ............... H10D 30/6723 |
| 2023/0189580 | A1* | 6/2023 | Kim ................... H10K 59/126 257/71 |

FOREIGN PATENT DOCUMENTS

| KR | 10-2019-0074812 A | 6/2019 |
| KR | 10-2021-0034135 A | 3/2021 |

OTHER PUBLICATIONS

Korean Intellectual Property Office, Office Action, Korean Patent Application No. 10-2022-0106100, Mar. 27, 2025, 14 pages.

* cited by examiner

*Primary Examiner* — Brook Kebede
(74) *Attorney, Agent, or Firm* — Fenwick & West LLP

(57) ABSTRACT

A display apparatus comprises a light emitting element, a driving transistor connected to the light emitting element, including a first oxide semiconductor layer and a first gate electrode, a switching transistor including a second oxide semiconductor layer and a second gate electrode, a data line supplying a data voltage, a first insulating layer disposed on the first gate electrode and the second gate electrode, and a second insulating layer disposed between the first insulating layer and the data line.

16 Claims, 9 Drawing Sheets

DISPLAY PANEL AND DISPLAY APPARATUS

CROSS-REFERENCE TO RELATED APPLICATION

This application claims the benefit of Republic of Korea Patent Application No. 10-2022-0106100 filed on Aug. 24, 2022, the contents of which is hereby incorporated by reference in their entirety.

BACKGROUND

Technical Field

The present disclosure relates to a display panel and a display apparatus, and more particularly, to a display panel including at least one oxide semiconductor and a display apparatus.

Discussion of the Related Art

A display apparatus including an organic light emitting diode (OLED) has become a trend in the field of display due to excellent thin film properties and image quality.

In the display apparatus including an organic light emitting diode, a light emitting element can be formed on a flexible substrate, and thus can constitute a screen in various forms such as bending or folding. In addition, the display apparatus including an organic light emitting diode can have excellent thin film properties. The display apparatus including an organic light emitting diode can be used in various electronic products, such as mobile phones and TVs, which require a thin thickness, as well as small electronic products such as smart watches, due to such advantages of the display apparatus including an organic light emitting diode.

Recently, a display apparatus is increasingly delivering information in a state of a still screen for implementation of an always on display (AOD) function and the like. A leakage current can occur as the state of the still screen continues, and accordingly, there is an increasing need for a display apparatus provided with a new type of driving element capable of preventing or at least reducing a leakage current from occurring.

SUMMARY

Accordingly, embodiments of the present disclosure are directed to provide a display panel including at least one oxide semiconductor and a display apparatus.

An aspect of the present disclosure is to provide a display panel that effectively blocks a leakage current by using a transistor including an oxide semiconductor layer and a display apparatus including the display panel.

Another aspect of the present disclosure is to provide a display panel that makes sure of uniform visibility by minimizing crosstalk between a data line and a transistor by using an insulating layer, and a display apparatus.

Additional features and aspects will be set forth in the description that follows, and in part will be apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

To achieve these and other aspects of the inventive concepts, as embodied and broadly described herein, a display apparatus can comprise a light emitting element, a driving transistor connected to the light emitting element and including a first oxide semiconductor layer, a switching transistor including a second oxide semiconductor layer, a data line supplying a data voltage, a first insulating layer disposed on a gate electrode of the switching transistor and a gate electrode of the driving transistor, and a second insulating layer disposed between the first insulating layer and the data line.

In accordance with another aspect of the present disclosure, a display panel can comprise a light emitting element, a driving transistor connected to the light emitting element and including a first oxide semiconductor layer, a switching transistor including a second oxide semiconductor layer, a data line supplying a data voltage, a first insulating layer disposed on a gate electrode of the switching transistor and a gate electrode of the driving transistor, and a second insulating layer disposed between the first insulating layer and the data line.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles of the disclosure.

In the drawings.

DETAILED DESCRIPTION OF THE DISCLOSURE

Figure 1:
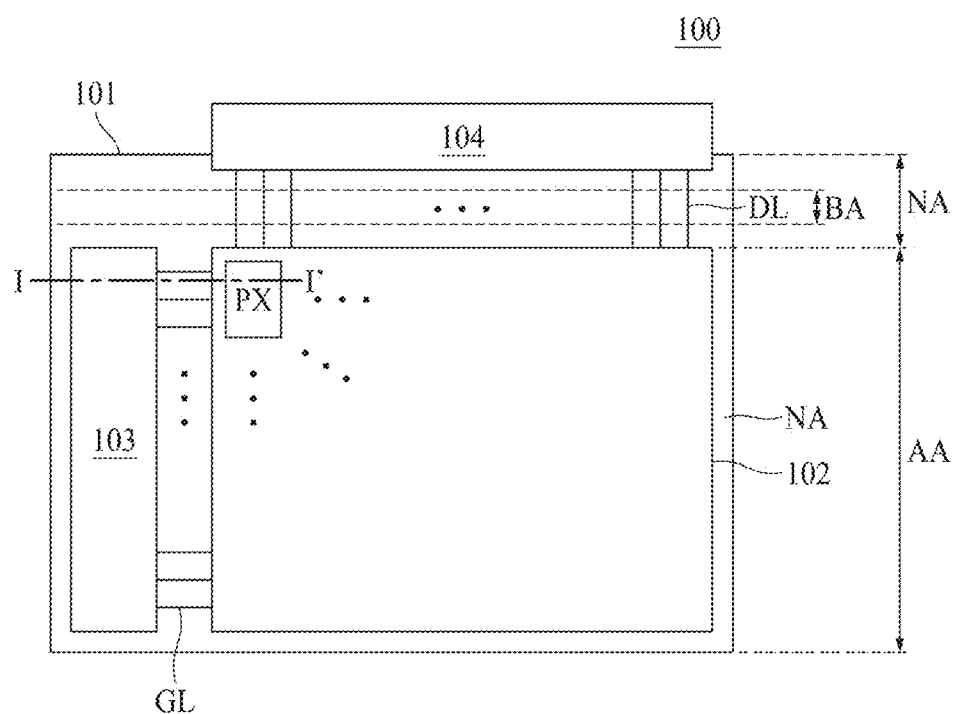
FIG. 1 is a block view illustrating a display apparatus according to one embodiment of the present disclosure.

The term used in embodiments has been selected from general terms currently widely used with consideration for functionality in this disclosure, but it can vary depending on the intent or promotion of those skilled in the art, the appearance of new technology, etc. If needed, the applicant can arbitrarily select the specific term. In this case, the meaning of the term will be described in detail in the corresponding description. Therefore, the term used in the present disclosure should be defined based on the meaning of the term and the contents throughout the disclosure, instead of the simple name of term.

When a certain part of the entire disclosure includes a certain element, this means not to exclude other components unless otherwise stated, but can further include other components.

The expression "at least one of A, B, and C" described throughout the disclosure can encompass "A alone", "B alone", "C alone", "A and B", "A and C", "B and C", or "all of A, B, and C". The advantages and features of the present disclosure, and methods of achieving them will become apparent with reference to the embodiments described in detail below in conjunction with the accompanying drawings.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted or can be briefly discussed.

In the case in which "comprise," "have", and "include" described in the present specification are used, another part can also be present unless "only" is used. The terms in a singular form can include plural forms unless noted to the contrary. In construing an element, the element is construed as including an error region although there is no explicit description thereof.

In describing a positional relationship, for example, when the positional order is described as "on," "above," "below," "beneath", and "next," etc., the case of no contact therebetween can be included, unless "direct" is used. For example, if it is mentioned that a first element is positioned "on" a second element, it does not mean that the first element is essentially or directly positioned above the second element in a figure.

It will be understood that, although the terms "first," "second," etc. can be used herein to describe various elements, these elements should not be limited by these terms. These terms are only used to distinguish one element from another and can not define any order or sequence. For example, a first element could be termed a second element, and, similarly, a second element could be termed a first element, without departing from the scope of the present disclosure.

The area, length, or thickness of each element described in the specification is illustrated for convenience of description, and the present disclosure is not necessarily limited to the area and thickness of the illustrated configuration.

Features of various embodiments of the present disclosure can be partially or overall coupled to or combined with each other and can be variously inter-operated with each other and driven technically as those skilled in the art can sufficiently understand. The embodiments of the present disclosure can be carried out independently from each other or can be carried out together in co-dependent relationship.

The terms which will be described later are selected from generally known and used terms considering their functions in the present disclosure, and can be modified depending on intention of a user or an operator, practices, or the like. Accordingly, the terms used herein should be defined by the description disclosed herein.

A transistor constituting a pixel circuit in the present disclosure can include at least one of an oxide thin film transistor (TFT), an amorphous silicon TFT (a-Si TFT), and a low temperature poly silicon (LTPS) TFT.

The following embodiments will be described based on an organic light emitting display apparatus. However, the embodiments of the present disclosure are not limited to the organic light emitting display apparatus, and can be applied to an inorganic light emitting display apparatus including an inorganic light emitting material. For example, the embodiments of the present disclosure can be applied to a quantum dot display apparatus.

It will be understood that the terms such as "first," "second" and "third" are only used to distinguish one element from another element in each embodiment, and the embodiments are not limited by these terms. Accordingly, the same terminology can refer to different elements depending on the embodiments.

Hereinafter, the embodiments of the present disclosure will be described with reference to the drawings.

FIG. 1 is a block view illustrating a display apparatus according to one embodiment of the present disclosure.

An electroluminescent display apparatus can be applied as a display apparatus 100 according to one embodiment of the present disclosure. The electroluminescent display apparatus can be an organic light emitting diode (OLED) display apparatus, a quantum dot light emitting diode display apparatus or an inorganic light emitting diode display apparatus.

Referring to FIG. 1, the display apparatus 100 includes a substrate 101, a display panel 102, a gate driver 103 and a data driver 104.

The display panel 102 includes an active area AA provided on the substrate 101 and a non-active area NA disposed around the active area AA. The substrate 101 is made of a plastic material having flexibility so as to enable bending. For example, the substrate 101 can be formed of a material such as polyimide (PI), polyethylene terephthalate (PET), polyethylene naphthalate (PEN), polycarbonate (PC), polyethersulfone (PES), polyarylate (PAR), polysulfone (PSF) or cyclo-olefin copolymer (COC), but the embodiments of the present disclosure are not limited thereto. However, glass is not excluded from the material of the substrate 101.

A subpixel of the active area AA includes a transistor (e.g., a thin film transistor (TFT) that includes an oxide semiconductor layer as an active layer).

At least one of the gate driver 103 or the data driver 104 can be disposed in the non-active area NA. The non-active area NA can further include a bending area BA in which the substrate 101 is bent.

In the embodiment, the gate driver 103 can be directly formed in the substrate 101 by using a transistor in which a polycrystalline semiconductor material is used as an active layer. In another embodiment, the gate driver 103 can be formed by constituting, as C-MOS, a transistor in which a polycrystalline semiconductor material is used as an active layer and a transistor in which an oxide semiconductor material is used as an active layer. The transistor having the oxide semiconductor layer and the transistor having the polycrystalline semiconductor layer can implement high resolution and low power due to high electron mobility in a channel.

A plurality of data lines and a plurality of gate lines can be disposed in the active area AA. For example, the plurality of data lines can be disposed in rows or columns, and the plurality of gate lines can be disposed in columns or rows. A subpixel PX can be disposed in an area defined by the data line and the gate line.

A basic pixel can include at least three subpixels among subpixels for emitting white (W) light, red (R) light, green (G) light or blue (B) light. For example, the basic pixel can include subpixels of combination of red (R), green (G) and blue (B), subpixels of combination of white (W), red (R) and green (G), subpixels of combination of blue (B), white (W) and red (R), or subpixels of combination of green (G), blue (B) and white (W), or can include subpixels of combination of white (W), red (R), green (G) and blue (B), but the embodiments of the present disclosure are not limited thereto.

A gate driving circuit included in the gate driver 103 can be disposed in the non-active area NA. The gate driving circuit of the gate driver 103 sequentially drives each pixel row of the active area by sequentially supplying scan signals to a plurality of gate lines GL. In this case, the gate driving circuit can be a scan driving circuit. The pixel row can be a row formed by pixels connected to one gate line.

The gate driving circuit can include a transistor having a polycrystalline semiconductor layer or a transistor having an oxide semiconductor layer. In the gate driving circuit, a transistor having a polycrystalline semiconductor layer and a transistor having an oxide semiconductor layer can be configured as a pair. When the transistors disposed in the non-active area NA and the active area AA use the same semiconductor material, the transistors disposed in the non-active area NA and the active area AA can be formed through the same process.

In the embodiment, the gate driving circuit can include a shift register, a level shifter, and the like. The gate driving circuit can be implemented in a Gate In Panel (GIP) type and then can be directly disposed in the substrate 101.

The gate driver 103 can sequentially supply scan signals of an ON voltage or an OFF voltage to the plurality of gate lines.

The display apparatus 100 according to one embodiment of the present disclosure can further include a data driving circuit. When a specific gate line is opened by the gate driver 103, the data driving circuit can convert image data into an analog data voltage and supply the data voltage to the plurality of data lines.

In the embodiment, each of the plurality of gate lines GL disposed in the substrate 101 can include at least one scan line and at least one light emission control line. The scan line and the light emission control line include a line for transferring different types of gate signals, for example, scan signals or light emission control signals to a gate node of different types of transistors, for example, a scan transistor or a light emission control transistor.

The gate driver 103 can include a scan driving circuit for outputting scan signals to a scan line which is one type of the gate lines GL and a light emitting driving circuit for outputting light emission control signals to a plurality of light emission control lines which are another types of the gate lines.

The data line DL can be disposed to pass through the bending area BA, and various data lines DL can be disposed to be connected to a data pad PAD. The bending area BA can be an area in which the substrate 101 is bent. The substrate 101 can be maintained in a flat state in an area excluding the bending area BA.

Figure 2:
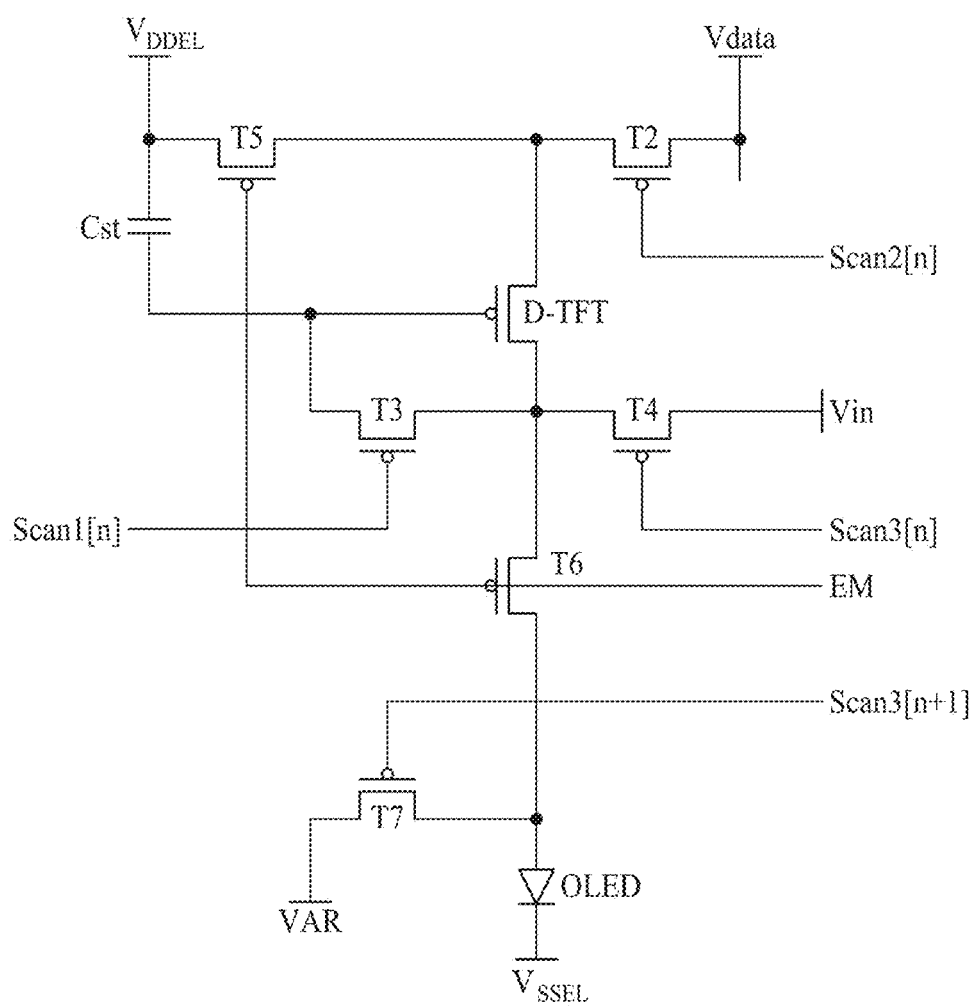
FIG. 2 is a circuit view illustrating a pixel of a display apparatus according to one embodiment of the present disclosure.

FIG. 2 is a circuit view illustrating a pixel of a display apparatus according to one embodiment of the present disclosure. In detail, FIG. 2 is a circuit view illustrating a pixel circuit for driving one subpixel included in the display apparatus.

Referring to FIG. 2, a pixel circuit 200 includes seven transistors (thin film transistors) and one storage capacitor Cst. One of the seven transistors can be a driving transistor, and the other transistors can be switching transistors for internal compensation, and the embodiments of the present disclosure are not limited thereto.

In the embodiment, a driving transistor D-TFT can use an oxide semiconductor layer (or an oxide semiconductor pattern) as an active layer. A third switching transistor T3 adjacent to the driving transistor D-TFT can also use the oxide semiconductor layer as the active layer. Another switching transistor, for example, at least one of a second switching transistor T2, a fourth switching transistor T4, a fifth switching transistor T5, a sixth switching transistor T6 or a seventh switching transistor T7 can use a polycrystalline semiconductor layer (or a polycrystalline semiconductor pattern) as an active layer, but this is only exemplary and is not limited thereto. At least one transistor included in the pixel circuit 200 can include an oxide semiconductor layer, and another at least one can include a polycrystalline semiconductor layer.

In the embodiment, the pixel circuit 200 can be connected to each line which provides a data voltage $V_{data}$, a high potential voltage $V_{DDEL}$, a low potential voltage $V_{SSEL}$, a reset voltage VAR, an initialization voltage Vin, an emission signal EM and scan signals Scan1[n], Scan2[n], Scan3[n] and Scan3[n+1]. Therefore, the pixel circuit 200 can receive the data voltage $V_{data}$, the high potential voltage $V_{DDEL}$, the low potential voltage $V_{SSEL}$, the reset voltage VAR, the initialization voltage Vin, the emission signal EM and the scan signals Scan1[n], Scan2[n], Scan3[n] and Scan3[n+1]. The data voltage $V_{data}$ can be an AC voltage, and the reset voltage VAR, the initialization voltage Vin, the high potential voltage $V_{DDEL}$ and the low potential voltage $V_{SSEL}$ can be DC voltages.

The pixel circuit 200 includes a light emitting element OLED. The light emitting element OLED can include an anode electrode, a light emitting layer and a cathode electrode. The anode electrode can be a pixel electrode disposed in each subpixel PX, and can be electrically connected to the driving transistor D-TFT of each subpixel PX. The cathode electrode can be a common electrode commonly disposed in a plurality of subpixels PX, and a low potential voltage $V_{SSEL}$ can be applied to the cathode electrode.

Figure 3:
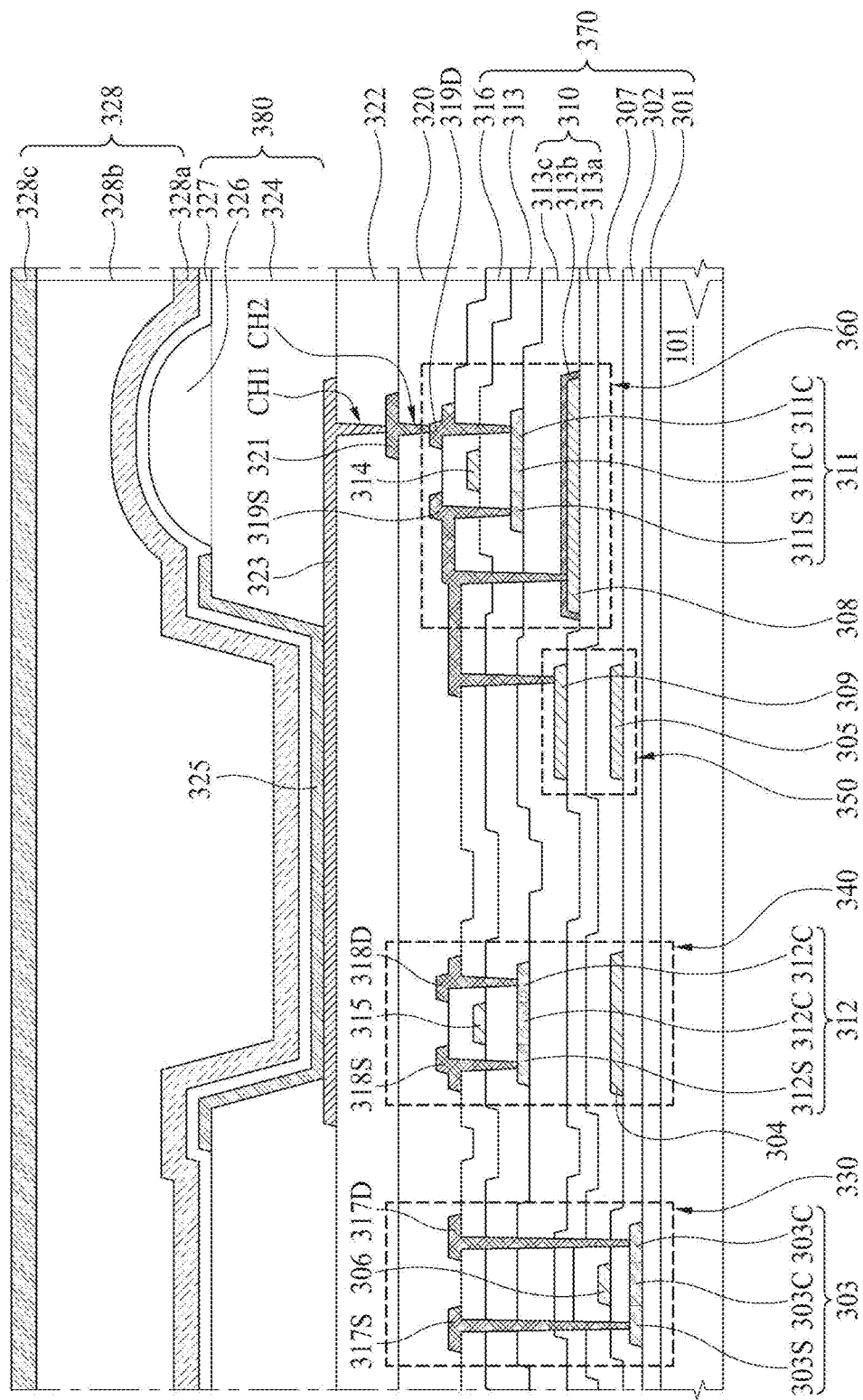
FIG. 3 is a cross-sectional view illustrating a display apparatus according to one embodiment of the present disclosure.

FIG. 3 is a cross-sectional view illustrating a display apparatus according to one embodiment of the present disclosure. In detail, FIG. 3 is a cross-sectional view illustrating one driving transistor 360, two switching transistors 330 and 340 and one storage capacitor 350.

The description will be briefly based on one subpixel PX. As shown in FIG. 3, the subpixel PX includes a driving element portion 370 and a light emitting element portion 380 on a substrate 101, wherein the light emitting element portion 380 is electrically connected to the driving element portion 370. The driving element portion 370 and the light emitting element portion 380 are insulated from each other by planarization layers 320 and 322.

The driving element portion 370 can refer to an array portion that includes a driving transistor 360, switching transistors 330 and 340 and a storage capacitor 350 to drive one subpixel. The light emitting element portion 380 can refer to an array portion that includes an anode electrode, a cathode electrode and a light emitting layer disposed between the anode electrode and the cathode electrode to emit light.

In FIG. 3, one driving transistor 360, two switching transistors 330 and 340 and one storage capacitor 350 are shown as an example of the driving element portion 370, but the present disclosure is not limited thereto.

In the embodiment, the driving transistor 360 and at least one switching transistor use an oxide semiconductor layer as an active layer. The oxide semiconductor layer is a layer made of an oxide semiconductor material, has an excellent leakage current blocking effect and has a relatively low manufacturing cost as compared with a transistor that uses a polycrystalline semiconductor layer. For example, the oxide semiconductor layer can be IGZO, ZnO, $SnO_2$, $Cu_2O$, NiO, ITZO, IAZO or the like, and the embodiments of the present disclosure are not limited thereto. Therefore, in order to reduce power consumption and lower the manufacturing cost, one embodiment of the present disclosure can implement the driving transistor 360 and at least one switching transistor by using the oxide semiconductor layer.

A transistor, which uses a polycrystalline semiconductor layer containing a polycrystalline semiconductor material, for example, polycrystalline silicon (poly-Si), has a fast operating speed and excellent reliability. Based on these advantages of the polycrystalline semiconductor layer, FIG. 3 shows an example in which one of the switching transistors is manufactured using a polycrystalline semiconductor layer. The other transistors can be comprised of a transistor that includes an oxide semiconductor layer, but the present disclosure is not limited to the embodiment shown in FIG. 3.

In the embodiment, the substrate 101 can be comprised of a multi-layer in which at least one organic layer and at least one inorganic layer are alternately stacked. For example, the substrate 101 can be formed by alternately stacking an organic layer such as polyimide and an inorganic layer such as silicon oxide ($SiO_2$), and the embodiments of the present disclosure are not limited thereto.

Referring to FIG. 3, a lower buffer layer 301 can be formed on the substrate 101. The lower buffer layer 301 can be intended to block a material, which is capable of being permeated from the outside, for example, moisture. The lower buffer layer 301 can be used by stacking a plurality of silicon oxide layers ($SiO_2$) and the like. According to the embodiment, a second buffer layer can be further formed on the lower buffer layer 301 to protect the substrate 101 from moisture permeation.

The first switching transistor 330 is formed on the substrate 101. The first switching transistor 330 can use a polycrystalline semiconductor layer as an active layer. The first switching transistor 330 can include a first active layer 303 that includes a channel through which electrons or holes move. The switching transistor 330 can include a first gate electrode 306, a first source electrode 317S and a first drain electrode 317D.

The first active layer 303 can be made of a polycrystalline semiconductor material. The first active layer 303 can include a first channel area 303C at the center, and can include a first source area 303S and a first drain area 303D with the first channel area 303C interposed therebetween.

The first source area 303S and the first drain area 303D can include an area in which impurity ions of group 5 or group 3, for example, phosphorus (P) or boron (B), are doped in an intrinsic polycrystalline semiconductor pattern at a predetermined concentration and then conductorized.

The first channel area 303C can provide a path through which electrons or holes move by maintaining the polycrystalline semiconductor material in an intrinsic state.

In the embodiment, the first switching transistor 330 can include a first gate electrode 306 that overlaps the first channel area 303C of the first active layer 303. A first gate insulating layer 302 can be disposed between the first gate electrode 306 and the first active layer 303.

In the embodiment, the first switching transistor 330 can be implemented in a top gate manner in which the first gate electrode 306 is positioned above the first active layer 303. In this case, a first capacitor electrode 305 made of a first gate electrode material and a second light shielding layer 304 of the second switching thin film transistor 340 can be formed through one mask process. Therefore, the mask process can be reduced.

In the embodiment, the first gate electrode 306 can be made of a metal material. For example, the first gate electrode 306 can be a single layer or multi-layer made of one of molybdenum (Mo), aluminum (Al), chromium (Cr), gold (Au), titanium (Ti), nickel (Ni), neodymium (Nd) and copper (Cu) or their alloy, but is not limited thereto.

In the embodiment, a first interlayer insulating layer 307 can be deposited on the first gate electrode 306. The first interlayer insulating layer 307 can be made of silicon nitride (SiNx). The first interlayer insulating layer 307, which is made of silicon nitride (SiNx), can include hydrogen particles. When a heat treatment process is performed after the first active layer 303 is formed and the first interlayer insulating layer 307 is deposited on the first active layer 303, the hydrogen particles included in the first interlayer insulating layer 307 can be permeated into the first source area 303S and the first drain area 303D to improve and stabilize conductivity of the polycrystalline semiconductor material. This can be referred to as a hydrogenation process.

In the embodiment, the first switching transistor 330 can further include an upper buffer layer 310, a second gate insulating layer 313 and a second interlayer insulating layer 316 on the first interlayer insulating layer 307 in due order, and includes a first source electrode 317S and a first drain electrode 317D, which are formed on the second interlayer insulating layer 316 and are connected to the first source area 303S and the first drain area 303D, respectively.

In the embodiment, the upper buffer layer 310 can space the first active layer 303 made of a polycrystalline semiconductor material apart from the second active layer 312 of the second switching transistor 340, which is made of an oxide semiconductor layer, and the third active layer 311 of the driving transistor 360. The upper buffer layer 310 can provide a basis in which the second active layer 312 and the third active layer 311 are formed.

In the embodiment, the second interlayer insulating layer 316 can include an interlayer insulating layer that covers the second gate electrode 315 of the second switching transistor 340 and the third gate electrode 314 of the driving transistor 360. Since the second interlayer insulating layer 316 is formed on the second active layer 312 and the third active layer 311, which are made of an oxide semiconductor material, the second interlayer insulating layer 316 can be comprised of an inorganic layer that does not include hydrogen particles.

In the embodiment, the first source electrode 317S and the first drain electrode 317D can be a single layer or multi-layer made of one of molybdenum (Mo), aluminum (Al), chromium (Cr), gold (Au), titanium (Ti), nickel (Ni), neodymium (Nd) and copper (Cu) or their alloy, but is not limited thereto.

In the embodiment, the second switching transistor 340 can include a second active layer 312 formed on the upper buffer layer 310 and comprised of a second oxide semiconductor layer, a second gate insulating layer 313 covering the second active layer 312, a second gate electrode 315 formed on the second gate insulating layer 313, a second interlayer insulating layer 316 covering the second gate electrode 315, and a second source electrode 318S and a second drain electrode 318D, which are formed on the second interlayer insulating layer 316.

According to the embodiment, the second switching transistor 340 can further include a second light shielding layer 304 positioned below the upper buffer layer 310 and overlap with the second active layer 312. In this case, the second light shielding layer 304 can be made of the same material as that of the first gate electrode 306 and can be formed on an upper surface of the first gate insulating layer 302.

According to the embodiment, the second light shielding layer 304 can be electrically connected (see a dotted line) to the second gate electrode 315 to form a dual gate. When the second switching transistor 340 has a dual gate structure, a flow of a current flowing to a second channel area 312C can be controlled more precisely, and the display apparatus can be manufactured to have a smaller size, whereby the display apparatus can be implemented at high resolution.

In the embodiment, the second active layer 312 can be made of an oxide semiconductor material, and can include a second channel area 312C of an intrinsic state, which is not doped with impurities, and a second source area 312S and a second drain area 312D, which are conductorized by being doped with impurities.

In the embodiment, in the same manner as the first source electrode 317S and the first drain electrode 317D, the second source electrode 318S and the second drain electrode 318D can be a single layer or multi-layer made of one of molybdenum (Mo), aluminum (Al), chromium (Cr), gold (Au), titanium (Ti), nickel (Ni), neodymium (Nd) and copper (Cu) or their alloy, and the embodiments of the present disclosure are not limited thereto.

In the embodiment, the second source electrode 318S and the second drain electrode 318D and the first source electrode 317S and the first drain electrode 317D can be simultaneously formed of the same material on the second interlayer insulating layer 316, and in this case, the number of mask processes can be reduced.

In the embodiment, the driving transistor 360 can be formed above the upper buffer layer 310. The driving transistor 360 can include a third active layer 311 comprised of a first oxide semiconductor layer. In this case, the first oxide semiconductor layer and the third active layer 311 are substantially the same as each other, and the same reference numerals are used to describe the first oxide semiconductor layer and the third active layer.

Conventionally, a polycrystalline semiconductor layer, which is a driving transistor and is advantageous for high-speed operation, is used as an active layer. However, a driving thin film transistor, which includes a polycrystalline semiconductor layer, has a problem in that high power consumption occurs due to a leakage current generated in an off-state. Therefore, one embodiment of the present disclosure proposes a driving transistor in which an oxide semiconductor layer advantageous for blocking occurrence of a leakage current is used as an active layer.

In case of the transistor in which the oxide semiconductor layer is used as the active layer, a current variation value for a unit voltage variation value is great in view of material characteristics of an oxide semiconductor, whereby a defect can occur in a low gray scale area that requires precise current control. Therefore, the embodiment of the present disclosure can provide a driving transistor in which a current variation value in an active layer is relatively insensitive to a variation value of a voltage applied to a gate electrode.

Referring to FIG. 3, the driving transistor 360 can include a third active layer 311 comprised of a first oxide semiconductor layer on the upper buffer layer 310, a second gate insulating layer 313 covering the third active layer 311, a third gate electrode 314 formed on the second gate insulating layer 313 and overlapped with the second active layer 311, a second interlayer insulating layer 316 covering the third gate electrode 314, and a third source electrode 319S and a third drain electrode 319D, which are disposed on the second interlayer insulating layer 316.

According to the embodiment, the driving transistor 360 can further include a first light shielding layer 308 disposed inside the upper buffer layer 310 and overlapped with the third active layer 311. The first light shielding layer 308 can be implemented to be inserted into the upper buffer layer 310.

The arrangement type in which the first light shielding layer 308 is disposed inside the upper buffer layer 310 will be described in consideration of process characteristics. The first light shielding layer 308 can be formed on an upper first sub buffer layer 310a disposed on the first interlayer insulating layer 307. An upper second sub buffer layer 310b completely covers the first light shielding layer 308 from the upper portion, and an upper third sub buffer layer 310c is formed on the upper second sub buffer layer 310b. That is, the upper buffer layer 310 has a structure in which the upper first sub buffer layer 310a, the upper second sub buffer layer 310b and the upper third sub buffer layer 310c are sequentially stacked.

In the embodiment, the first sub buffer layer 310a and the third sub buffer layer 310c can be made of silicon oxide ($SiO_2$). The first sub buffer layer 310a and the third sub buffer layer 310c are made of silicon oxide ($SiO_2$) that does not include hydrogen particles, and thus can serve as bases of the second switching thin film transistor 340 and the driving transistor 360, in which an oxide semiconductor layer of which reliability can be damaged by hydrogen particles is used as an active layer.

The upper second sub buffer layer 310b can be made of silicon nitride (SiNx) having excellent collection capability with respect to hydrogen particles. The second sub buffer layer 310b can be formed to surround both an upper surface and sides of the first light shielding layer 308 to completely seal the first light shielding layer 308.

The hydrogen particles generated during the hydrogenation process of the first switching transistor 330 in which the polycrystalline semiconductor layer is used as the active layer can damage reliability of the oxide semiconductor layer positioned on the upper buffer layer 310 by passing through the upper buffer layer 310. That is, when the hydrogen particles are permeated into the oxide semiconductor layer, a problem can occur in that the transistor, which includes the oxide semiconductor layer, has different threshold voltages or variable channel conductivity depending on its position or conductivity.

However, since the silicon nitride (SiNx) included in the upper buffer layer 310 has excellent collection capability with respect to hydrogen particles as compared with the silicon oxide ($SiO_2$), reliability damage to the driving transistor 360, which is generated when hydrogen particles are permeated into the oxide semiconductor layer, can be avoided.

In the embodiment, the first light shielding layer 308 can be comprised of a metal layer containing a titanium (Ti) material having excellent collection capability with respect to hydrogen particles. For example, the first light shielding layer 308 can include a single layer of titanium (Ti), a multi-layer of molybdenum (Mo) and titanium (Ti) or an alloy of molybdenum (Mo) and titanium (Ti), but is not limited thereto. The first light shielding layer 308 can include another metal layer containing titanium (Ti).

In this case, titanium (Ti) can collect hydrogen particles diffused in the upper buffer layer 310 to prevent or at least reduce the hydrogen particles from reaching the first oxide semiconductor layer 311. The first light shielding layer 308 of the driving transistor 360 can be formed of a metal layer such as titanium, which has a capability to collect hydrogen particles, and can be surrounded by the silicon nitride (SiNx) having the collection capability with respect to the hydrogen particles, thereby making sure of reliability of the oxide semiconductor pattern with respect to the hydrogen particles.

In the embodiment, the upper second sub buffer layer 310b containing silicon nitride (SiNx) can be deposited only on a portion of an upper surface of the first sub buffer layer 310a to selectively cover only the first light shielding layer 308 without being deposited on an entire surface of the display area like the upper first sub buffer layer 310a. Since the second sub buffer layer 310b is formed of a material different from that of the first sub buffer layer 310a, that is, a silicon nitride layer (SiNx), when the second sub buffer layer 310b is deposited on the entire surface of the display area, a film gap can occur. In order to solve this problem, the second sub buffer layer 310b can be selectively formed only in a position where the first light shielding layer 308, which is required in view of the function of the second sub buffer layer 310b, is formed.

In the embodiment, the first light shielding layer 308 and the upper second sub buffer layer 310b can be formed vertically below the first oxide semiconductor layer 311 so as to overlap the first oxide semiconductor layer 311 in view of their functions. The first light shielding layer 308 and the second sub buffer layer 310b can be formed to be larger than the first oxide semiconductor layer 311 so as to completely overlap the first oxide semiconductor layer 311.

In the embodiment, the third source electrode 319S of the driving transistor 360 can be electrically connected to the first light shielding layer 308.

In the embodiment, the storage capacitor 350 can store the data voltage applied through the data line for a predetermined period of time and provide the stored data voltage to the light emitting element. The storage capacitor 350 can include two electrodes corresponding to each other and a dielectric disposed between the two electrodes. The storage capacitor 350 can include a first capacitor electrode 305 formed of the same material as that of the first gate electrode 306 and disposed on the same layer as the first gate electrode 306, and a second capacitor electrode 309 formed of the same material as that of the first light shielding layer 308 and disposed on the same layer as the first light shielding layer 308. The first interlayer insulating layer 307 and the upper first sub buffer layer 310a can be positioned between the first capacitor electrode 305 and the second capacitor electrode 309. The second capacitor electrode 309 of the storage capacitor 350 can be electrically connected to the third source electrode 319S.

FIG. 3 shows an example in which the storage capacitor 350 and the driving transistor 360 are formed to be distinguished from each other on one side, but the present disclosure is not limited thereto. In accordance with the embodiment, the storage capacitor 350 can be formed in the form of being stacked with the driving transistor 360. In this case, at least a portion of the third source electrode 319S connected to the second capacitor electrode 309 can be omitted. For example, a fourth gate electrode can be further formed on the third gate electrode 314 of the driving transistor 360. At this time, the third gate electrode 314 and the fourth gate electrode can be spaced apart from each other at a predetermined distance, and a capacitor can be formed based thereon. A detailed example related to this case will be described with reference to FIG. 6 or 9.

In the embodiment, a first planarization layer 320 and a second planarization layer 322, which planarize an upper end of the driving element portion 370, can be disposed on the driving element portion 370. The first planarization layer 320 and the second planarization layer 322 can be made of an organic layer such as polyimide or acrylic resin.

The light emitting element portion 380 is formed on the second planarization layer 322. The light emitting element portion 380 includes a first electrode 323 as an anode electrode, a second electrode 327 which is a cathode electrode corresponding to the first electrode 323, and a light emitting layer 325 interposed between the first electrode 323 and the second electrode 327. The first electrode 323 can be formed for each subpixel.

In the embodiment, the light emitting element portion 380 can be connected to the driving element portion 370 through a connection electrode 321 formed on the first planarization layer 320. For example, the first electrode 323 of the light emitting element portion 380 and the third drain electrode 319D of the driving transistor 360 constituting the driving element portion 370 can be connected to each other by the connection electrode 321.

In the embodiment, the first electrode 323 can be connected to the connection electrode 321 exposed through a contact hole CH1 passing through the second planarization layer 322. In addition, the connection electrode 321 can be connected to the third drain electrode 319D exposed through a contact hole CH2 passing through the first planarization layer 320.

The first electrode 323 can be formed in a multi-layered structure including a transparent conductive film and an opaque conductive film having high reflection efficiency. The transparent conductive film is made of a material having a relatively large work function value such as indium-tin-oxide (ITO) or indium-zinc-oxide (IZO). The opaque conductive film can have a single layered structure or multi-layered structure, which includes Al, Ag, Cu, Pb, Mo, Ti or their alloy, and the embodiments of the present disclosure are not limited thereto. For example, the first electrode 323 can be formed in a structure in which a transparent conductive film, an opaque conductive film and a transparent conductive film are sequentially stacked, or can be formed in a structure in which a transparent conductive film and an opaque conductive film are sequentially stacked, and the embodiments of the present disclosure are not limited thereto.

In the embodiment, the light emitting layer 325 can be formed by stacking a hole-related layer, an organic light emitting layer and an electron-related layer on the first electrode 323 in due order or reverse order. A bank layer 324 can expose the first electrode 323 of each subpixel, and can be referred to as a pixel defining layer. In accordance with the embodiment, the bank layer 324 can be formed of an opaque material, for example, black, to avoid optical interference between adjacent subpixels. In this case, the bank layer 324 can include a light shielding material made of at least one of a color pigment, organic black or carbon, and the embodiments of the present disclosure are not limited thereto. A spacer 326 can be disposed on the bank layer 324.

In the embodiment, the second electrode 327, which is a cathode electrode, faces the first electrode 323 with the light emitting layer 325 interposed therebetween, and is formed on an upper surface and sides of the light emitting layer 325. The second electrode 327 can be integrally formed on an entire surface of the active area. When the second electrode 327 is applied to a top emission type organic light emitting display apparatus, the second electrode 327 can be made of a transparent conductive film such as indium-tin-oxide (ITO) or indium-zinc-oxide (IZO), but the embodiments of the present disclosure are not limited thereto.

In the embodiment, an encapsulation portion 328 for suppressing moisture permeation can be further disposed on the second electrode 327. The encapsulation portion 328 can include a first inorganic encapsulation layer 328a, a second organic encapsulation layer 328b and a third inorganic encapsulation layer 328c, which are sequentially stacked.

The first inorganic encapsulation layer 328a and the third inorganic encapsulation layer 328c of the encapsulation portion 328 can be formed of an inorganic material such as silicon oxide (SiOx). The second organic encapsulation layer 328b of the encapsulation portion 328 can be formed of an organic material such as acryl resin, epoxy resin, phenolic resin, polyamide resin and polyimide resin, but the embodiments of the present disclosure are not limited thereto.

Figure 4:
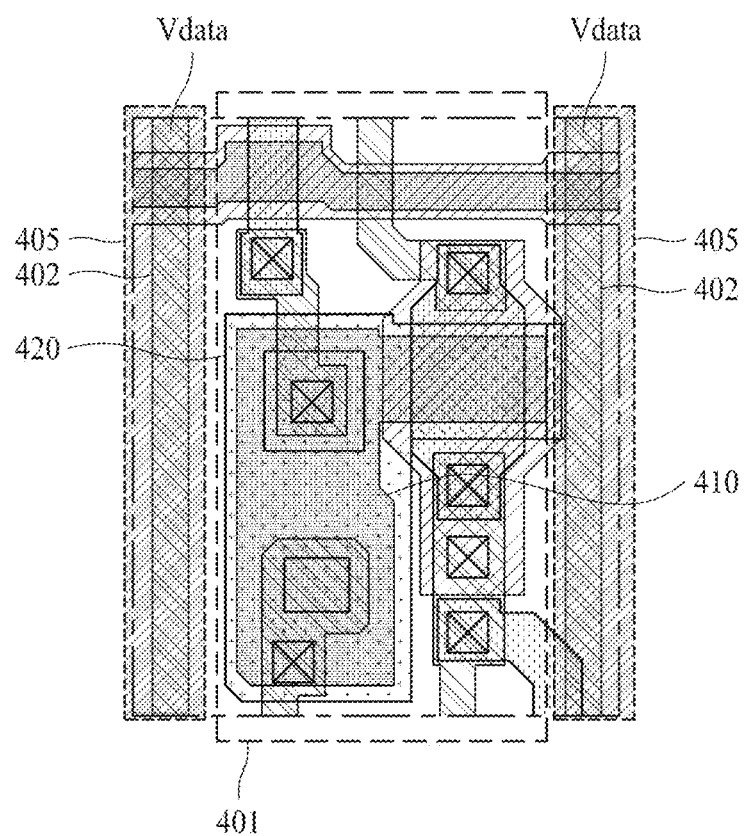
FIG. 4 is a plan view illustrating a display apparatus according to one embodiment of the present disclosure.

FIG. 4 is a plan view of a display apparatus according to one embodiment of the present disclosure. In detail, FIG. 4 is a plan view of one area of a display apparatus in which a pixel circuit 401 is disposed.

Referring to FIG. 4, a data line 402 for providing a data voltage $V_{data}$ can be disposed in the display apparatus. An insulating layer 405 can be disposed to overlap the data line 402. For example, the insulating layer 405 can be disposed on a lower end of the data line 402 to overlap the data line 402. As shown, a width (or area) of the insulating layer 405 can be greater than that of the data line 402.

In the embodiment, the data line 402 can be disposed on both sides of the pixel circuit 401. In this case, the insulating layer 405 can be disposed at a lower end of each of the data lines 402 disposed on both sides of the pixel circuit 401.

The pixel circuit 401 can include a driving transistor and at least one switching transistor. The driving transistor can include at least one of a first gate electrode 410 and a second gate electrode 420. For example, the driving transistor can include a first gate electrode 410. For another example, the driving transistor can include a first gate electrode 410 and a second gate electrode 420.

When the driving transistor includes a first gate electrode 410 and a second gate electrode 420, the second gate electrode 420 can be disposed on the first gate electrode 410. At least a portion of the first gate electrode 410 and at least a portion of the second gate electrode 420 can overlap each other. For example, the second gate electrode 420 can be disposed on the first gate electrode 410 to cover the first gate electrode 410 with a larger area than the first gate electrode 410.

Figure 5:
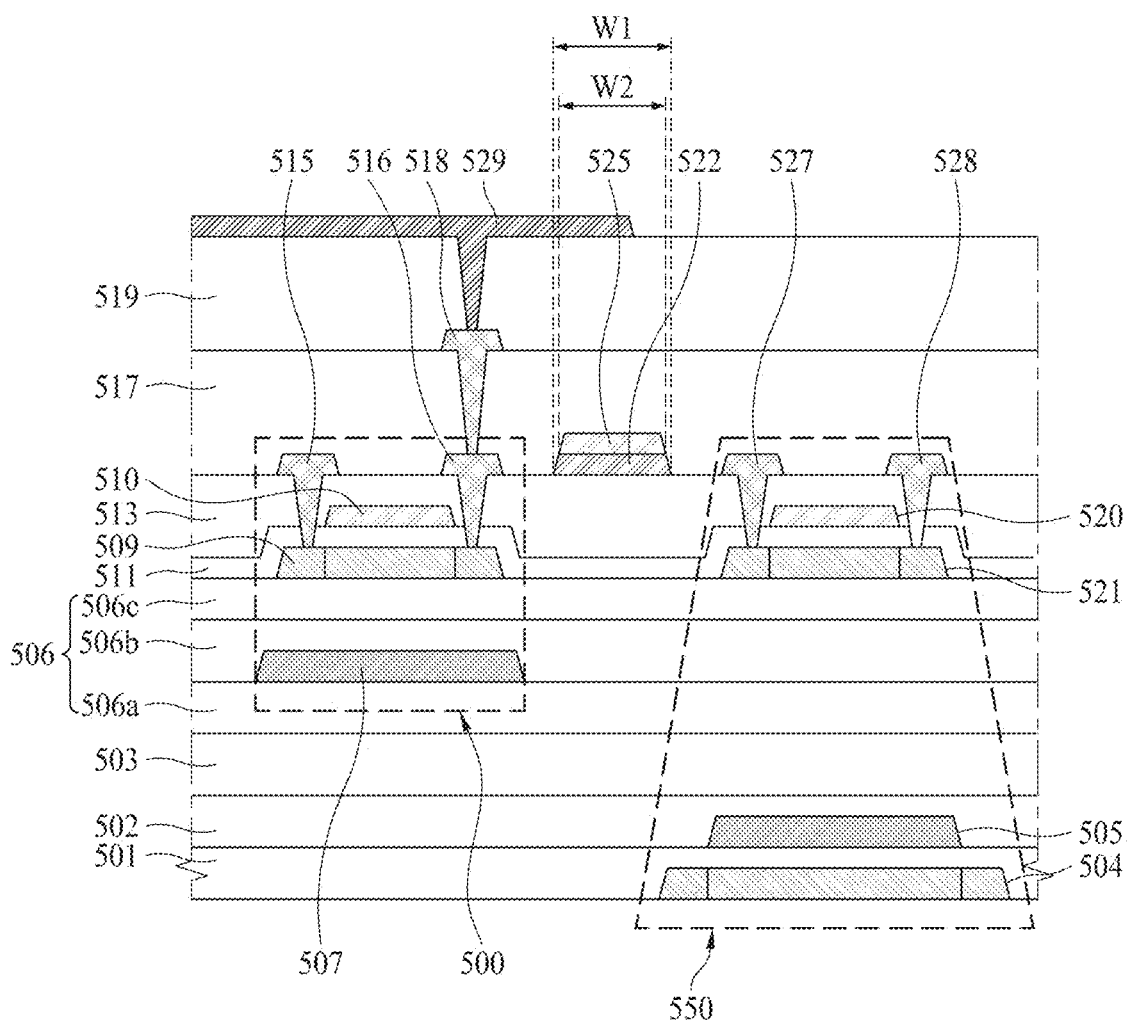
FIG. 5 is a cross-sectional view illustrating a driving transistor and a switching transistor of a display apparatus according to one embodiment of the present disclosure.

FIG. 5 is a cross-sectional view illustrating a driving transistor and a switching transistor of a display apparatus according to one embodiment of the present disclosure. Hereinafter, the description duplicated with FIG. 3 can be omitted.

For convenience of description, FIG. 5 is a conceptual view illustrating the driving transistor 360 of FIG. 3 as a driving transistor 500 and illustrating the switching transistor 340 as a switching transistor 550. In the following drawings as well as FIG. 5, some elements described in FIG. 3, for example, the arrangement of the storage capacitor 350 can be omitted or implemented in other embodiments. In FIG. 5, the positions of the driving transistor 500 and the switching transistor 550 are differently arranged in comparison with FIG. 3, but the embodiments of the present disclosure are not limited thereto.

Referring to FIG. 5, a first lower buffer layer 501, a second lower buffer layer 502 and a lower insulating layer 503 can be disposed on a substrate. The first lower buffer layer 501 and the second lower buffer layer 502 can be intended to block a material (e.g., moisture) which can be permeated from the outside. The first lower buffer layer 501 and the second lower buffer layer 502 can be formed of, for example, a silicon oxide ($SiO_2$) layer. The lower insulating layer 503 is an element for insulating different layers from each other, and can be comprised of, for example, silicon nitride (SiNx).

In the embodiment, a semiconductor layer 504 can be formed on the substrate. The semiconductor layer 504 can include an oxide semiconductor layer or a polycrystalline semiconductor layer. The semiconductor layer 504 can be intended for driving of the switching transistor 550. The first lower buffer layer 501 can be formed to cover the semiconductor layer 504.

A first metal layer (or a light shielding layer) 505 can be formed on the first lower buffer layer 501. The first metal layer 505 can be electrically connected to a second oxide semiconductor layer 521 of the switching transistor 550. The first metal layer 505 can be made of, for example, molybdenum (Mo), but is not limited thereto. The first metal layer 505 can be implemented as a single layer or multi-layer made of any one of molybdenum (Mo), aluminum (Al), chromium (Cr), gold (Au), titanium (Ti), nickel (Ni), neodymium (Nd) and copper (Cu), or their alloy, and the embodiments of the present disclosure are not limited thereto. The second lower buffer layer 502 can be formed to cover the first metal layer 505.

In the embodiment, an upper buffer layer 506 can be formed on the lower insulating layer 503. The upper buffer layer 506 can include an upper first sub buffer layer 506a, an upper second sub buffer layer 506b and an upper third sub buffer layer 506c. A second metal layer 507 can be formed on the upper first sub buffer layer 506a. The second metal layer 507 can be made of, for example, titanium (Ti), but is not limited thereto. The second metal layer 507 can be implemented as a single layer or multi-layer made of any one of molybdenum (Mo), aluminum (Al), chromium (Cr), gold (Au), titanium (Ti), nickel (Ni), neodymium (Nd) and copper (Cu), or their alloy, and the embodiments of the present disclosure are not limited thereto.

In the embodiment, the second metal layer 507 can be electrically connected to a source electrode 515 of the driving transistor 500. The second metal layer 507 can be formed to overlap a first oxide semiconductor layer 509. The upper second sub buffer layer 506b can be formed to cover the second metal layer 507. The upper third sub buffer layer 506c can be formed on the upper second sub buffer layer 506b.

The first oxide semiconductor layer 509 of the driving transistor 500 and a second oxide semiconductor layer 521 of the switching transistor 550 can be formed on the upper third sub buffer layer 506c. The first oxide semiconductor layer 509 of the driving transistor 500 can overlap at least a portion of the second metal layer 507. The second oxide semiconductor layer 521 of the switching transistor 550 can overlap at least a portion of the first metal layer 505.

In the embodiment, the first oxide semiconductor layer 509 can be used as an active layer of the driving transistor 500. The first oxide semiconductor layer 509 can be referred to as an active layer or an oxide active layer in accordance with the embodiment, but is not limited thereto.

A gate insulating layer 511 can be formed to cover the first oxide semiconductor layer 509. The gate insulating layer 511 can be formed to correspond to a shape of an upper surface of the first oxide semiconductor layer 509 as shown in FIG. 5, but is not limited thereto. The gate insulating layer 511 can be formed so that its upper portion can be flat. A gate electrode of each of the driving transistor 500 and the switching transistor 550 can be formed on the gate insulating layer 511. In detail, a first gate electrode 510 of the driving transistor 500 can be formed on the gate insulating layer 511 to overlap the first oxide semiconductor layer 509 of the driving transistor 500. The second gate electrode 520 of the switching transistor 550 can be formed on the gate insulating layer 511 to overlap the second oxide semiconductor layer 521 of the switching transistor 550.

A first insulating layer 513 can be disposed to cover the first gate electrode 510 and the second gate electrode 520. An upper surface of the first insulating layer 513 can be planarized. A second insulating layer 522 can be disposed on the first insulating layer 513. The second insulating layer 522 can be disposed to be distinguished from the driving transistor 500. For example, the second insulating layer 522 can be disposed so as not to overlap at least a portion of the driving transistor 500. For another example, the second insulating layer 522 can be disposed to overlap a data line 525. The data line 525 includes a line disposed to be adjacent to the driving transistor 500 and electrically connected to the driving transistor 500 to provide the data voltage $V_{data}$.

In the embodiment, a width W1 of the second insulating layer 522 can be equal to or greater than a width W2 of the data line 525. An area of the second insulating layer 522 can be equal to or greater than that of the data line 525. In this case, the data line 525 can overlap the second insulating layer 522. At least a portion of the second insulating layer 522 can overlap the data line 525.

In the embodiment, a thickness of the first insulating layer 513 can be 1000 Å or more and 7000 Å or less, and the embodiments of the present disclosure are not limited thereto. As the thickness of the first insulating layer 513 is greater than or equal to 10001, a distance between the first gate electrode 510 and the data line 525 can be ensured. A thickness of the second insulating layer 522 can be 1000 Å or more and 7000 Å or less, and the embodiments of the present disclosure are not limited thereto. As the thickness of the second insulating layer 522 is greater than or equal to 1000 Å, the distance between the first gate electrode 510 and the data line 525 can be further ensured.

In the embodiment, an interval between the data line 525 and the first gate electrode 510 of the driving transistor 500 can be effectively ensured by the second insulating layer 522 disposed below the data line 525. In this case, vertical crosstalk between the first gate electrode 510 and the data line 525 can be blocked (or minimized). As a result, crosstalk of the display apparatus is blocked, whereby luminance uniformity can be ensured.

In the embodiment, the source electrode 515 and a drain electrode 516 of the driving transistor 500 can be connected to the first oxide semiconductor layer 509 by passing through the first insulating layer 513 and the gate insulating layer 511. A source electrode 527 and a drain electrode 528 of the switching transistor 550 can be connected to the second oxide semiconductor layer 521 by passing through the first insulating layer 513 and the gate insulating layer 511.

A first planarization layer 517 can be disposed on the source electrode 515 and the drain electrode 516 of the driving transistor 500, the source electrode 527 and the drain electrode 528 of the switching transistor 550 and the data line 525. A connection electrode 518 can be disposed by passing through the first planarization layer 517. A second planarization layer 519 can be disposed on the connection electrode 518. A first electrode 529 of the light emitting element can be disposed by passing through the second planarization layer 519. The first electrode 529 can correspond to a cathode electrode. The remaining elements of the light emitting element, for example, a light emitting layer, a node electrode, a touch element, a touch electrode or a touch line can be disposed on the first electrode 529. The touch element can be disposed on a layer higher than the light emitting element.

Figure 6:
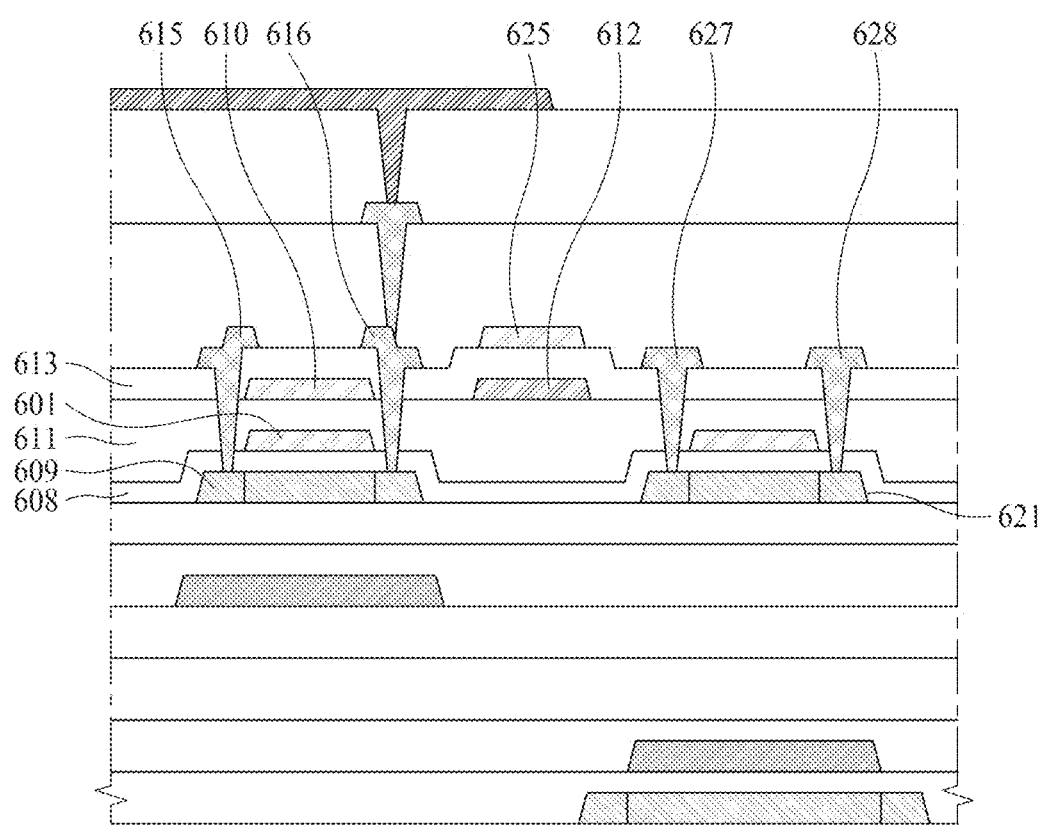
FIG. 6 is another cross-sectional view illustrating a driving transistor and a switching transistor of a display apparatus according to one embodiment of the present disclosure.

FIG. 6 is another cross-sectional view illustrating a driving transistor and a switching transistor of a display apparatus according to one embodiment of the present disclosure. Hereinafter, in FIG. 6, the description duplicated with the aforementioned description can be omitted.

Referring to FIG. 6, a second gate electrode 610 and a second insulating layer 612 (e.g., the second insulating layer 522 of FIG. 5) of a driving transistor (e.g., the driving transistor 500 of FIG. 5) can be disposed on a first insulating layer 611 (e.g., the first insulating layer 513 of FIG. 5). A third insulating layer 613 can be disposed to cover the second gate electrode 610 and the second insulating layer 612.

A source electrode 615 (e.g., the source electrode 515 of FIG. 5) and a drain electrode 616 (e.g., the drain electrode 516 of FIG. 5) of a driving transistor and a source electrode 627 (e.g., the source electrode 515 of FIG. 5) and a drain electrode 628 (e.g., the drain electrode 518 of FIG. 5) of the switching transistor (e.g., the switching transistor 550 of FIG. 5) can be disposed on the third insulating layer 613. The source electrode 615 and the drain electrode 616 of the driving transistor can be connected to a first oxide semiconductor 609 (e.g., the first oxide semiconductor layer 509 of FIG. 5) of the driving transistor by passing through the third insulating layer 613 and the first insulating layer 611. The source electrode 627 and the drain electrode 628 of the switching transistor can be connected to a second oxide semiconductor layer 621 of the switching transistor, for example, the second oxide semiconductor layer 521 of FIG. 5 by passing through the third insulating layer 613, the first insulating layer 611 and a gate insulating layer 608, for example, the gate insulating layer 511 of FIG. 5.

When the second gate electrode 610 is formed above the first gate electrode 601 as shown in FIG. 6, a storage capacitor based on the first gate electrode 601 and the second gate electrode 610 can be formed. In this case, the display apparatus can be more miniaturized than the case that the storage capacitor is disposed on the side of the driving transistor. In addition, the storage capacitor can be controlled by controlling a thickness of the first insulating layer 611 in the existing elements, for example, the first gate electrode 601 (e.g., the first gate electrode 510 of FIG. 5), the second gate electrode 610 and the first insulating layer 611 without an additional element. For example, as the thickness of the first insulating layer 611 is reduced, the storage capacitor can be increased. As the thickness of the first insulating layer 611 is increased, the storage capacitor can be reduced.

Figure 7:
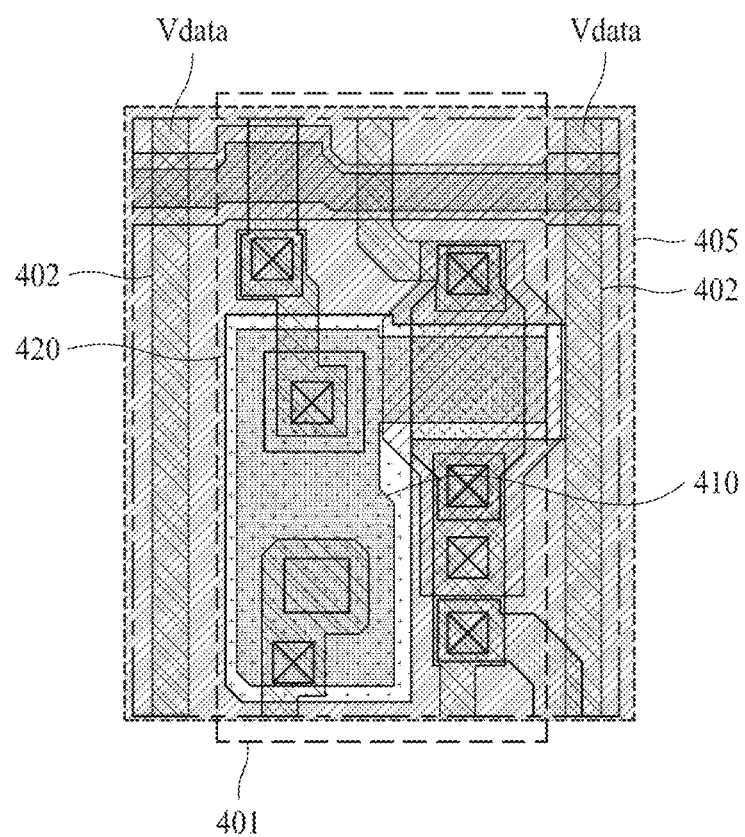
FIG. 7 is a plan view illustrating a display apparatus according to another embodiment of the present disclosure.

FIG. 7 is a plan view illustrating a display apparatus according to another embodiment of the present disclosure. In detail, FIG. 7 is a plan view illustrating one area of a display apparatus in which a pixel circuit 401 is disposed. Hereinafter, the description duplicated with the description made with reference to FIG. 4 can be omitted.

Referring to FIG. 7, the data line 402 can be disposed on both sides of the pixel circuit 401. The insulating layer 405 can be disposed on the lower end of the data line 402. The insulating layer 405 can be disposed to overlap the other areas except for the first gate electrode 410 and the second gate electrode 420 of the driving transistor among the elements of the pixel circuit 401. For example, the insulating layer 405 can be disposed to overlap at least one switching transistor of the pixel circuit 401. An area in which the insulating layer 405 is disposed can be positioned to be higher than some elements of the switching transistor, and can be positioned to be lower than some other elements of the switching transistor. A detailed example related to this case will be described with reference to FIG. 8 or 9.

Figure 8:
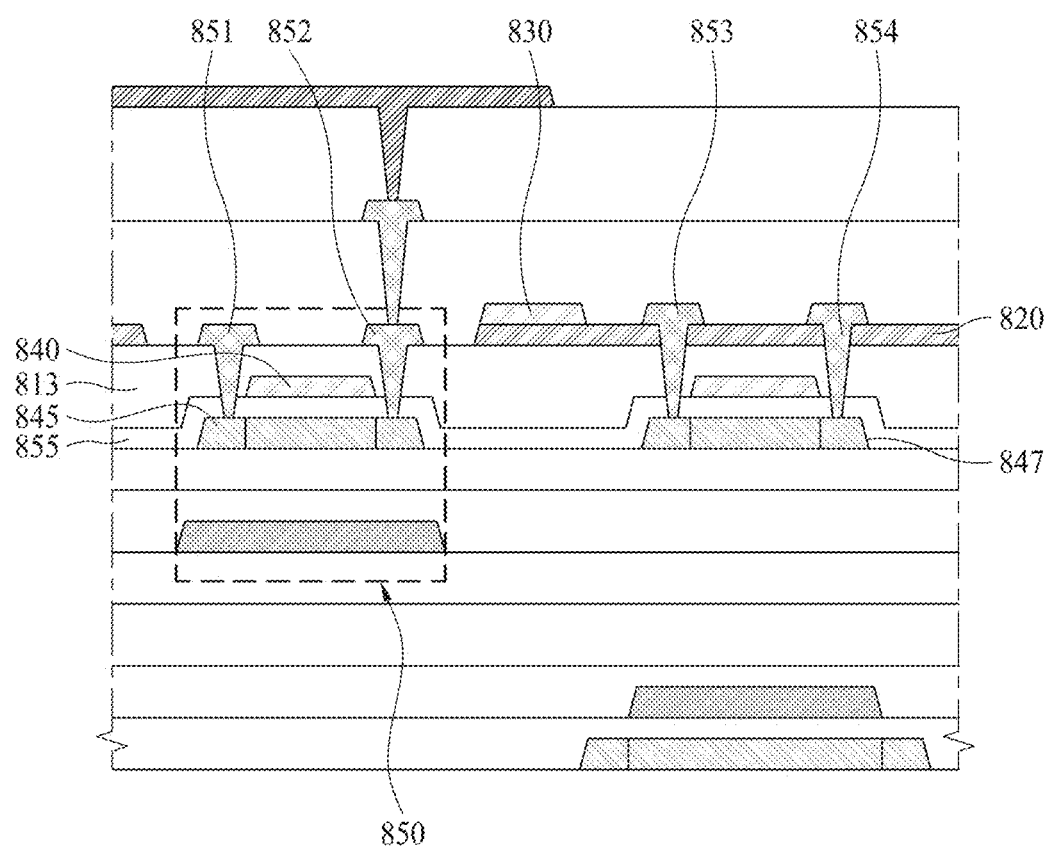
FIG. 8 is a cross-sectional view illustrating a driving transistor and a switching transistor of a display apparatus according to another embodiment of the present disclosure.

FIG. 8 is a cross-sectional view illustrating a driving transistor and a switching transistor of a display apparatus according to another embodiment of the present disclosure. Hereinafter, the description duplicated with the aforementioned description can be omitted.

Referring to FIG. 8, a second insulating layer 820, for example, the second insulating layer 522 of FIG. 5 can be disposed on a first insulating layer 813 (e.g., the first insulating layer 513 of FIG. 5). The second insulating layer 820 can be disposed to be distinguished from a driving transistor 850, for example, the driving transistor 500 of FIG. 5.

As an example, the second insulating layer 820 can be disposed so as not to overlap at least a portion of elements included in the driving transistor 850. For example, the second insulating layer 820 can be disposed so as not to overlap a first gate electrode 840, for example, the first gate electrode 510 of FIG. 5. For another example, the second insulating layer 820 can be disposed so as not to overlap the first gate electrode 840 and a first oxide semiconductor layer 845, for example, the first oxide semiconductor layer 509 of FIG. 5.

As another example, the second insulating layer 820 can be disposed to be distinguished from the driving transistor 850 in view of the elements included in the driving transistor 850. For example, the second insulating layer 820 can be disposed at a lateral top end in a diagonal direction with respect to the first gate electrode 840.

When the second insulating layer 820 is disposed to be distinguished from the driving transistor 850, a source electrode 851 of the driving transistor, for example, the source electrode 515 and a drain electrode 852, for example, the drain electrode 516 of FIG. 5 can be disposed in a layer lower than a source electrode 853 of the switching transistor, for example, the source electrode 527 and a drain electrode 854, for example, the drain electrode 528 of FIG. 5. For example, a distance (hereinafter, a first distance) from an upper surface of the first insulating layer 813 to each of the source electrode 851 and the drain electrode 852 of the driving transistor can be shorter than a distance (hereinafter, a second distance) from the upper surface of the first insulating layer 813 to each of the source electrode 853 and the drain electrode 854 of the switching transistor. A difference between the second distance and the first distance can correspond to a thickness of the second insulating layer 820.

The source electrode 851 and the drain electrode 852 of the driving transistor can be connected to the first oxide semiconductor layer 845, for example, the first oxide semiconductor layer 509 of FIG. 5, by passing through the first insulating layer 813 and a gate insulating layer 855, for example, the gate insulating layer 511 of FIG. 5. The source electrode 853 and the drain electrode 854 of the switching transistor can be connected to a second oxide semiconductor layer 847, for example, the second oxide semiconductor layer 521 of FIG. 5, by passing through the first insulating layer 813, the second insulating layer 820 and the gate insulating layer 855.

A data line 830, for example, the data line 525 of FIG. 5, can be disposed on the second insulating layer 820 to overlap the second insulating layer 820. The source electrode 851 and the drain electrode 852 of the driving transistor can overlap the first oxide semiconductor layer 845, and can be disposed on the first insulating layer 813. The source electrode 853 and the drain electrode 854 of the switching transistor can overlap a second oxide semiconductor layer 847, and can be disposed on the second insulating layer 820.

Figure 9:
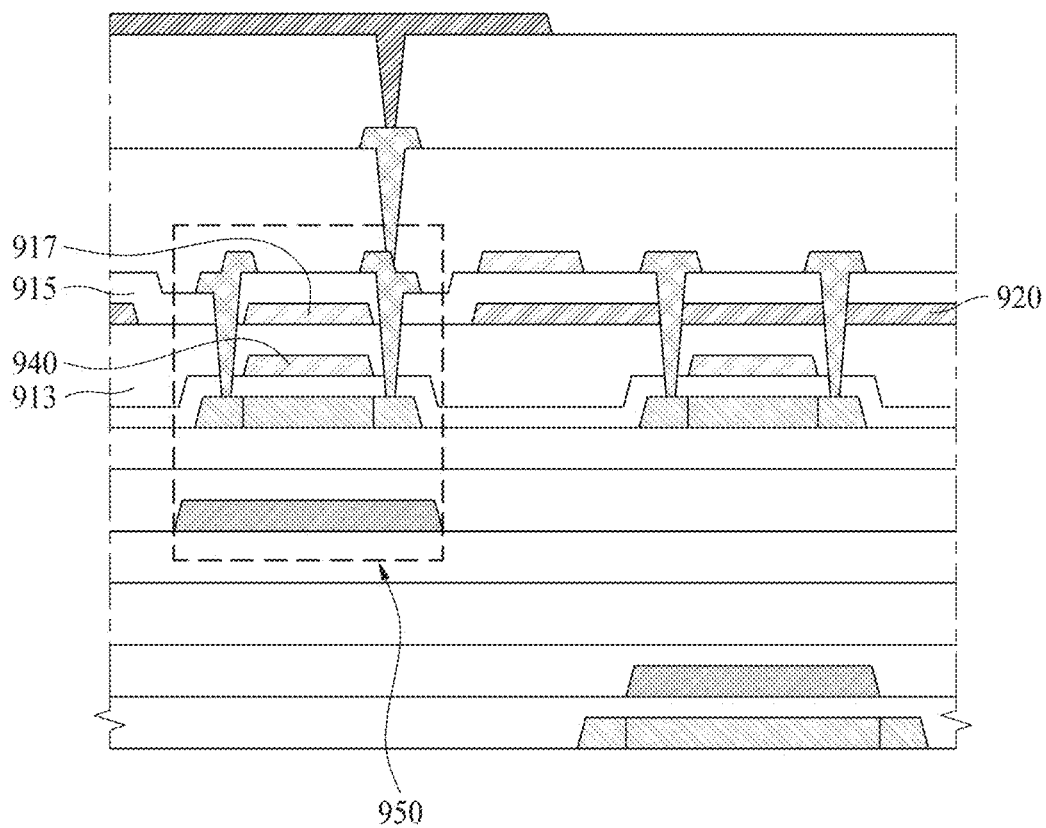
FIG. 9 is another cross-sectional view illustrating a driving transistor and a switching transistor of a display apparatus according to another embodiment of the present disclosure.

FIG. 9 is another cross-sectional view illustrating a driving transistor and a switching transistor of a display apparatus according to another embodiment of the present disclosure.

Referring to FIG. 9, a second insulating layer 920 and a sub-gate electrode 917 can be disposed on a first insulating layer 913. The second insulating layer 920 and the sub-gate electrode 917 can be spaced apart from each other. The sub-gate electrode 917 can be disposed in an area of the driving transistor 950. The sub-gate electrode 917 can be disposed to overlap the first gate electrode 940 of the driving transistor 950.

In the embodiment, the second insulating layer 920 can be disposed to be distinguished from the area of the driving transistor 950. For example, the second insulating layer 920 can be disposed to be spaced apart from the area of the driving transistor 950. In this case, the second insulating layer 920 can be disposed to include at least a portion in an area of the switching transistor. The area of the driving transistor 950 corresponds to an area in which elements included in the driving transistor 950 are disposed. The area of the switching transistor corresponds to an area in which elements included in the switching transistor are disposed. In this case, at least a portion of the switching transistor and at least a portion of the second insulating layer 920 can overlap each other.

According to the present disclosure, the following advantageous effects can be obtained.

The display panel and the display apparatus according to the present disclosure can effectively block a leakage current by using a transistor that includes an oxide semiconductor layer.

Also, the display panel and the display apparatus according to the present disclosure can make sure of visibility of the display panel by minimizing crosstalk between the data line and the transistor by using the insulating layer.

A display apparatus according to some embodiments of the present disclosure can comprise a light emitting element, a driving transistor connected to the light emitting element and including a first oxide semiconductor layer and a first gate electrode, a switching transistor including a second oxide semiconductor layer and a second gate electrode, a data line supplying a data voltage, a first insulating layer disposed on the first gate electrode and the second gate electrode, and a second insulating layer disposed between the first insulating layer and the data line.

According to some embodiments of the present disclosure, the driving transistor can further include a sub-gate electrode, and the sub-gate electrode can be disposed on the first insulating layer to at least partially overlap the first gate electrode.

According to some embodiments of the present disclosure, a width of the sub-gate electrode can be wider than that of the first gate electrode.

According to some embodiments of the present disclosure, the sub-gate electrode can be disposed on the same plane as the second insulating layer.

According to some embodiments of the present disclosure, the display apparatus can further comprise a third insulating layer covering the sub-gate electrode and the second insulating layer, wherein the data line can be disposed on the third insulating layer.

According to some embodiments of the present disclosure, a thickness of the second insulating layer can be greater than that of the sub-gate electrode.

According to some embodiments of the present disclosure, in the third insulating layer, an upper surface of an area overlapped with the first gate electrode and an upper surface of an area overlapped with the second gate electrode can be on different planes.

According to some embodiments of the present disclosure, the second insulating layer can be further disposed on at least a portion of the first insulating layer overlapped with the second gate electrode.

A display panel according to some embodiments of the present disclosure can comprise a light emitting element, a driving transistor connected to the light emitting element and including a first oxide semiconductor layer and a first gate electrode, a switching transistor including a second oxide semiconductor layer and a second gate electrode, a data line supplying a data voltage, a first insulating layer disposed on the first gate electrode and the second gate electrode, and a second insulating layer disposed between the first insulating layer and the data line.

According to some embodiments of the present disclosure, the driving transistor can further include a sub-gate electrode, and the sub-gate electrode can be disposed on the first insulating layer to at least partially overlap the first gate electrode.

According to some embodiments of the present disclosure, a width of the sub-gate electrode can be wider than that of the first gate electrode.

According to some embodiments of the present disclosure, the sub-gate electrode can be disposed on the same plane as the second insulating layer.

According to some embodiments of the present disclosure, the display panel can further comprise a third insulating layer covering the sub-gate electrode and the second insulating layer, wherein the data line can be disposed on the third insulating layer.

According to some embodiments of the present disclosure, a thickness of the second insulating layer can be greater than that of the sub-gate electrode.

According to some embodiments of the present disclosure, in the third insulating layer, an upper surface of an area overlapped with the first gate electrode and an upper surface of an area overlapped with the second gate electrode can be on different planes.

According to some embodiments of the present disclosure, the second insulating layer can be further disposed on at least a portion of the first insulating layer overlapped with the second gate electrode.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display apparatus comprising:
   a light emitting element;
   a driving transistor electrically connected to the light emitting element and including a first oxide semiconductor layer and a first gate electrode;
   a switching transistor including a second oxide semiconductor layer and a second gate electrode;
   a data line supplying a data voltage;
   a first insulating layer disposed on the first gate electrode and the second gate electrode; and
   a second insulating layer disposed between the first insulating layer and the data line.

2. The display apparatus of claim 1, wherein the driving transistor further includes a sub-gate electrode, and
   the sub-gate electrode is disposed on the first insulating layer, wherein the sub-gate electrode at least partially overlaps with the first gate electrode.

3. The display apparatus of claim 2, wherein a width of the sub-gate electrode is wider than a width of the first gate electrode.

4. The display apparatus of claim 2, wherein the sub-gate electrode is disposed on a same layer as the second insulating layer.

5. The display apparatus of claim 4, further comprising a third insulating layer covering the sub-gate electrode and the second insulating layer,
   wherein the data line is disposed on the third insulating layer.

6. The display apparatus of claim 4, wherein a thickness of the second insulating layer is greater than a thickness of the sub-gate electrode.

7. The display apparatus of claim 5, wherein, in the third insulating layer, an upper surface of an area that overlaps with the first gate electrode and an upper surface of an area that overlaps with the second gate electrode are on different layers.

8. The display apparatus of claim 1, wherein the second insulating layer is further disposed on at least a portion of the first insulating layer that overlaps with the second gate electrode.

9. A display panel comprising:
   a light emitting element;
   a driving transistor electrically connected to the light emitting element and including a first oxide semiconductor layer and a first gate electrode;
   a switching transistor including a second oxide semiconductor layer and a second gate electrode;
   a data line supplying a data voltage;
   a first insulating layer disposed on the first gate electrode and the second gate electrode; and a second insulating layer disposed between the first insulating layer and the data line.

10. The display panel of claim 9, wherein the driving transistor further includes a sub-gate electrode, and
the sub-gate electrode is disposed on the first insulating layer, wherein the sub-gate electrode at least partially overlaps with the first gate electrode.

11. The display panel of claim 10, wherein a width of the sub-gate electrode is wider than a width of the first gate electrode.

12. The display panel of claim 10, wherein the sub-gate electrode is disposed on a same plane as the second insulating layer.

13. The display panel of claim 12, further comprising a third insulating layer covering the sub-gate electrode and the second insulating layer,
wherein the data line is disposed on the third insulating layer.

14. The display panel of claim 12, wherein a thickness of the second insulating layer is greater than a thickness of the sub-gate electrode.

15. The display panel of claim 13, wherein, in the third insulating layer, an upper surface of an area that overlaps with the first gate electrode and an upper surface of an area that overlaps with the second gate electrode are on different layers.

16. The display panel of claim 9, wherein the second insulating layer is further disposed on at least a portion of the first insulating layer that overlaps with the second gate electrode.

* * * * *